(12) United States Patent
Fan

(10) Patent No.: US 11,122,708 B1
(45) Date of Patent: Sep. 14, 2021

(54) ELECTRONIC DEVICE

(71) Applicant: BEIJING XIAOMI MOBILE SOFTWARE CO., LTD., Beijing (CN)

(72) Inventor: Jie Fan, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/987,102

(22) Filed: Aug. 6, 2020

(30) Foreign Application Priority Data

Mar. 13, 2020 (CN) .......................... 202010177304.0

(51) Int. Cl.
| | |
|---|---|
| *H05K 7/20* | (2006.01) |
| *H05K 1/18* | (2006.01) |
| *H05K 1/02* | (2006.01) |
| *H05K 1/14* | (2006.01) |
| *H02M 3/07* | (2006.01) |

(52) U.S. Cl.
CPC ......... *H05K 7/2039* (2013.01); *H05K 1/0203* (2013.01); *H05K 1/0277* (2013.01); *H05K 1/144* (2013.01); *H05K 1/181* (2013.01); *H02M 3/07* (2013.01); *H05K 2201/10151* (2013.01)

(58) Field of Classification Search
CPC .. H05K 7/2039; H05K 1/0203; H05K 1/0277; H05K 1/144; H05K 1/181; H05K 2201/10151; H02M 3/07
USPC .......................................................... 361/721
See application file for complete search history.

(56) References Cited

U.S. PATENT DOCUMENTS

| | | | |
|---|---|---|---|
| 2017/0222465 A1* | 8/2017 | Hawley | H02J 7/007192 |
| 2018/0288889 A1* | 10/2018 | Fordham | H01R 12/79 |
| 2019/0089821 A1* | 3/2019 | Wang | H04M 1/0233 |

OTHER PUBLICATIONS

Extended European Search Report dated Feb. 16, 2021 in European Patent Application No. 20193064.1, 8 pages.

* cited by examiner

*Primary Examiner* — Sherman Ng
(74) *Attorney, Agent, or Firm* — Oblon, McClelland, Maier & Neustadt, L.L.P.

(57) ABSTRACT

The disclosure provides an electronic device that includes a first circuit board, a second circuit board, a charge pump chipset, a battery, and a control component. The charge pump chipset can be coupled to the battery, and include at least two charge pump chips provided on the first circuit board and at least two charge pump chips provided on the second circuit board. The control component is configured to control one charge pump chip on the first circuit board and at least one charge pump chip on the second circuit board to be in a working state at the same time and, in response to a temperature of the charge pump chip on the first circuit board in the working state being higher than a set threshold, to switch any charge pump chip on the first circuit board with the temperature lower than the set threshold to the working state.

13 Claims, 3 Drawing Sheets

ELECTRONIC DEVICE

CROSS REFERENCE TO RELATED APPLICATION

This application is based on and claims priority to Chinese patent application No. 202010177304.0, filed on Mar. 13, 2020, the entire content of which is hereby incorporated into this application by reference in its entirety.

TECHNICAL FIELD

The present disclosure relates to a field of charging technologies of electronic devices, and more particularly, to an electronic device.

BACKGROUND

Currently, fast charging technology is a popular development trend of electronic devices. The fast charging technology enables electricity quantity of a battery in an electronic device to reach a level of normal use in a relatively short period of time. However, the fast charging also brings a problem of serious heat generation during charging, so how to solve the problem of heat generation during the charging has become an urgent matter.

SUMMARY

The present disclosure provides an electronic device to solve the defect of poor user experience of fast charging technology resulted from heat generated by charge pump chips.

Embodiments of the present disclosure provide an electronic device. The electronic device includes a first circuit board, a second circuit board, a charge pump chipset, a battery, and a control component. The second circuit board is provided on the first circuit board. The charge pump chipset is coupled to the battery, and includes at least two charge pump chips provided on the first circuit board, and at least two charge pump chips provided on the second circuit board. The charge pump chips on the first circuit board are coupled in parallel with the charge pump chips on the second circuit board. The control component is configured to control one charge pump chip on the first circuit board and at least one charge pump chip on the second circuit board to be in a working state at the same time, and in response to a temperature of the charge pump chip on the first circuit board in the working state being higher than a set threshold, switches any charge pump chip on the first circuit board with the temperature lower than the set threshold to the working state.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Figure 1:
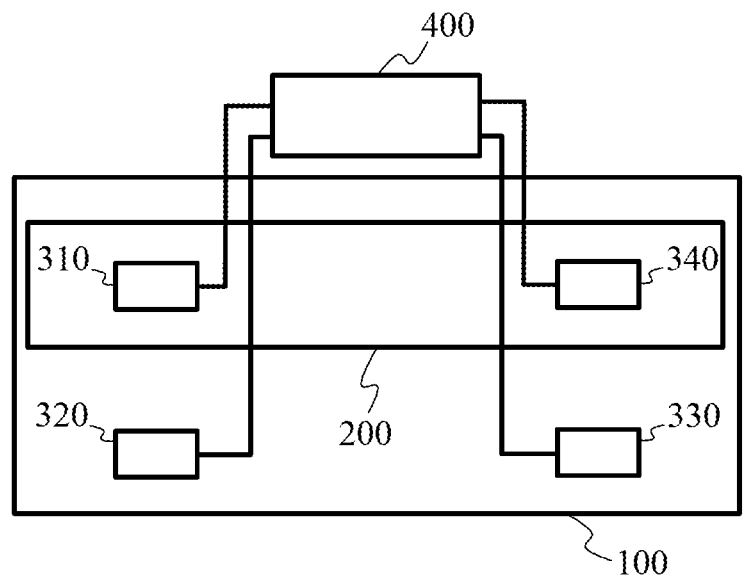
FIG. 1 is a schematic diagram of circuit boards in an electronic device according to an exemplary embodiment.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Terms used in the present disclosure are for the purpose of describing specific embodiments only, and are not intended to limit the present disclosure. Unless otherwise defined, the technical or scientific terms used in the present disclosure shall have usual meanings understood by persons of ordinary skill in the field to which the present disclosure belongs. Words such as "a" and "one" used in the specification and claims do not limit the quantity; rather, they mean at least one. Unless otherwise specified, words such as "comprise" or "include" mean that elements or objects before "comprise" or "include" cover elements or objects listed after "comprise" or "include" and their equivalents, and other components or objects are not excluded. "Connected", "linked" and similar words are not limited to physical or mechanical connections, rather, they may include direct or indirect electrical connections.

The singular forms "a", "said" and "the" used in the present disclosure and attached claims are also intended to include plural forms, unless the context clearly indicates other meanings. It should also be understood that terms "and/or" as used herein refer to and include any or all possible combinations of one or more associated listed items.

A charge pump chip is a converter capable of reducing voltage and increasing current, and is used as one of components of a charging module in an electronic device to achieve fast charging. Related fast charging solution can use two charge pump chips simultaneously. However, when a charging power exceeds 100 W, capacity conversion loss of the charge pump chip is high, resulting in a rapid increase in temperature of the electronic device. The body of the electronic device being hot affects user experience.

In addition, when the temperature in the electronic device is excessively high, the charge pump chip is suppressed from generating heat by reducing a charging current. In this manner, the length of time of charging with a large current is shortened, charging speed is slowed down, and the experience of fast charging is affected.

In view of the above, embodiments of the present disclosure provide an electronic device to adapt to a charging solution of a charging power of 100 W or more. The electronic device may be charged with a large current for a long period of time in a charge only state and a screen-on charging state to increase the charging speed. In addition, during the charging process, the heat generated by the charge pump chipset can be effectively suppressed, thereby optimizing the user experience. The electronic device according to embodiments of the present disclosure may be selected from a mobile phone, a tablet computer, a wearable device (for example, a smart watch, a smart bracelet, a helmet, or a pair of glasses), a vehicle-mounted device, or a medical device.

Figure 2:
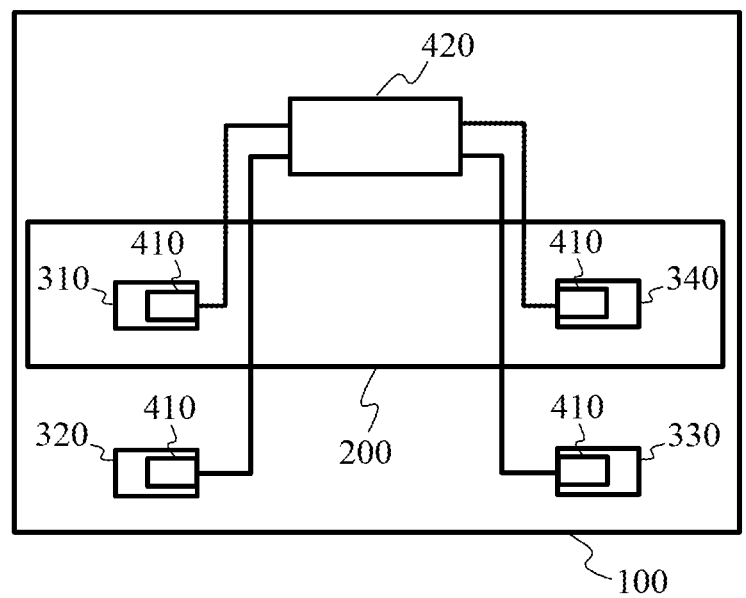
FIG. 2 is a schematic diagram of circuit boards in an electronic device according to another exemplary embodiment.

FIG. 1 and FIG. 2 are schematic diagrams of circuit boards in an electronic device according to different exemplary embodiments. As illustrated in FIG. 1, the electronic device provided by the embodiment of the present disclosure can include a first circuit board 100, a second circuit board 200, a charge pump chipset, a battery, and a control component 400.

The second circuit board 200 is provided on the first circuit board 100. Optionally, the second circuit board 200 is soldered to the first circuit board 100 through a via structure, that is, the second circuit board 200 is electrically connected to the first circuit board 100.

Regarding the distribution manner of the second circuit board 200 on the first circuit board 100, as an example illustrated by FIG. 1, the second circuit board 200 is a complete circuit board provided on the first circuit board 100. As another example illustrated by FIG. 2, the second circuit board 200 can include a plurality of sub-circuit boards 210 dispersedly arranged on the first circuit board 100. In such a case, the plurality of sub-circuit boards 210 of the second circuit board 200 are spaced at a set distance, that is, the plurality of parts of the second circuit board 200 are not in contact.

The charge pump chipset is connected to the battery to charge the battery. The charge pump chipset includes at least two charge pump chips provided on the first circuit board 100 and at least two charge pump chips provided on the second circuit board 200. As an example, in FIG. 1, the charge pump chipset includes a charge pump chip 310 and a charge pump chip 340 provided on the first circuit board 100, and a charge pump chip 320 and a charge pump chip 330 provided on the second circuit board 200.

In a case where the second circuit board 200 includes the plurality of sub-circuit boards arranged dispersedly, optionally, the charge pump chips are arranged on the sub-circuit boards 210 of the second circuit board 200 in a one-to-one correspondence. In addition, the second circuit board 200 includes a first surface facing the first circuit board 100 and a second surface opposite to the first surface. The charge pump chips are disposed on the second surface of the second circuit board 200.

In addition to the charge pump chips, functional modules such as a central processing unit (CPU) of the electronic device, a radio frequency module, and a camera module can also be provided on the first circuit board 100. Therefore, there are relatively many heating devices on the first circuit board 100. In this case, the first circuit board 100 and the second circuit board 200 are used in a coordinated manner, so that the charge pump chips on the second circuit board 200 and the first circuit board 100 form relatively independent heat sources, avoiding an excessive local temperature of the electronic device when the charge pump chips are used. In addition, respective charge pump chips in the charge pump chipset can be connected in parallel. In this manner, when the plurality of charge pump chips are used at the same time, the current shared by each charge pump chip is reduced, thereby reducing the heat generated by each charge pump chip.

Regarding how the charge pump chips are distributed on the first circuit board 100 and the second circuit board 200, in an embodiment, at least two charge pump chips on the first circuit board 100 and at least two charge pump chips on the second circuit board 200 are disposed on respective vertices of a polygon. Taking the case illustrated in FIG. 1 as an example, two charge pump chips (320, 330) are provided on the first circuit board 100, and two charge pump chips (310, 340) are provided on the second circuit board 200. The four charge pump chips are disposed on vertices of a quadrilateral. The two charge pump chips on the first circuit board 100 are located on one side of the quadrilateral, and the two charge pump chips on the second circuit board 200 are located on the other side of the quadrilateral. That is, the charge pump chip 310 and the charge pump chip 330 are disposed on one diagonal of the quadrilateral, and the charge pump chip 320 and the charge pump chip 340 are disposed on the other diagonal of the quadrilateral.

In this manner, the plurality of charge pump chips are dispersedly distributed on the first circuit board 100 and the second circuit board 200. When in use, the plurality of charge pump chips form dispersed heat sources to reduce or prevent the local temperature of the electronic device from being too high during the charging process.

The control component 400 is connected to the charge pump chips, and is configured to control on or off of the charge pump chips on the first circuit board 100 and the second circuit board 200. In addition, the control component 400 is further configured to monitor temperatures of the charge pump chips on the first circuit board 100 and the second circuit board 200. In detail, during the charging process, the control component 400 controls one charge pump chip on the first circuit board 100 and at least one charge pump chip on the second circuit board 200 to be in the working state at the same time. At this time, the charge pump chips in the working state on the first circuit board 100 and the second circuit board 200 form relatively independent heat sources to prevent the local temperature of the electronic device from being too high during the charging process. In addition, in response to a temperature of a charge pump chip on the first circuit board 100 in the working state being higher than a set threshold, the control component 400 switches another charge pump chip on the first circuit board 100 to the working state.

In this manner, the charge pump chips on the first circuit board 100 are used in turn, forming dynamically distributed heat sources. During charging, the charge pump chips on the first circuit board 100 are used in turn to extend the length of time for each charge pump chip to charge with the large current, thereby increasing the charging speed and optimizing the user experience.

Charging states of the electronic device include the charge only state and the screen-on charging state. In the charge only state, the electronic device only performs charging. Consequently, the charge pump chips in the electronic device are the main heat sources in the electronic device, while other functional modules such as most of the circuit of the CPU, the radio frequency module, and the display screen module are in an inactive state. In the screen-on charging state, the electronic device is in a normal use state, and thus other functional modules in addition to the charge pump chips are also in the working state, forming several heat sources in the electronic device.

With the electronic device according to embodiments of the present disclosure, in the charge only state, the control component 400 controls one charge pump chip on the first circuit board 100 and one charge pump chip on the second circuit board 200 to be in the working state at the same time. In addition, in response to the temperature of each of charge pump chips in the working state on the first circuit board 100 and the second circuit board 200 being higher than the set threshold, the other charge pump chips on the first circuit board 100 and the second circuit board 200 are switched to work.

Referring to FIG. 1, the control component 400 controls the charge pump chip 310 and the charge pump chip 330 to simultaneously be in the working state, and in response to the temperature of each of the charge pump chip 310 and the charge pump chip 330 being higher than the set threshold (which, for example, may be set to 38° C. in the charge only state), switches the charge pump chip 320 and the charge pump chip 340 to the working state.

In this manner, in the charge only state, groups of the charge pump chips on different diagonals work in turn, so that heat generated by the charge pump chips in the working state are dispersed as much as possible. In addition, while one group of charge pump chips is working, the other group of charge pump chips dissipates heat, performing alternate work. In this manner, an overall heating speed of the electronic device is effectively slowed down, thereby prolonging the length of time for the charge pump chips to charge with the large current, that is, increasing the charging speed.

In the screen-on charging state, the control component 400 controls one charge pump chip on the first circuit board 100 and at least two charge pump chips on the second circuit board 200 to be in the working state at the same time. In addition, in response to the temperature of the charge pump chip in the working state on the first circuit board 100 being higher than the set threshold, the control component 400 switches another charge pump chip on the first circuit board 100 to work while keeping the charge pump chips on the second circuit board 200 in the working state.

Referring to FIG. 1, the control component 400 controls the charge pump chip 310, the charge pump chip 320, and the charge pump chip 330 to be in the working state at the same time. In addition, in response to the temperature of the charge pump chip 310 being higher than the set threshold (which may be set to 39° C. in the screen-on charging state), the charge pump chip 340 is switched to work while the charge pump chip 320 and the charge pump chip 330 are kept in the working state. In this manner, in the screen-on charging state, at least three charge pump chips are in the working state at the same time. The use of the charge pump chips in the screen-on charging state is explained as follows.

Generally, in order to ensure power supply safety, the charging current in the screen-on charging state is weaker than the charging current in the charge only state. In this case, the two charge pump chips in a charging state on the second circuit board generate little heat. For example, the charging current in the screen-on charging state is 5 A. When the three charge pump chips work at the same time, the current shared by each charge pump chip in the charging state on the second circuit board can be 1.66 A. At this time, it is difficult for the temperature of the charge pump chip to rise to the set threshold of the screen-on charging state. In addition, as the first circuit board has other heat sources (functional modules on the first circuit board), the temperature of the charge pump chip on the first circuit board rises quickly. Based on this, in the screen-on charging state, the temperature of the charge pump chip on the first circuit board being higher than the set threshold is determined as a trigger condition for switching the charge pump chip.

In addition, the set threshold in the screen-on charging state is higher than the set threshold in the charge only state. Due to there being more heat sources on the first circuit board in the screen-on charging state, the temperature of the charge pump chip on the first circuit board rises relatively quickly, and thus the set threshold in the screen-on charging state is higher than the set threshold in the charge only state to ensure that the charge pump chips in the screen-on charging state on the first circuit board have a reasonable temperature climbing space, avoiding frequent switches of the charge pump chips.

For the electronic device according to embodiments of the present disclosure, the dispersed heat sources are formed in the electronic device, since in the charge only state and the screen-on charge state, the charge pump chips on the first circuit board and the charge pump chips on the second circuit board are set to work at the same time. In this manner, the heat generation of the charge pump chips are effectively controlled during the charging process, and the user experience is optimized. In addition, on the basis of the temperatures of the charge pump chips on the first circuit board, different charge pump chips on the first circuit board and the second circuit board are controlled to work in a time-sharing mode. Consequently, the length of time that the charge pump chipset charges the power supply with the large current is prolonged, and the charging speed of the fast charging is increased.

Figure 3:
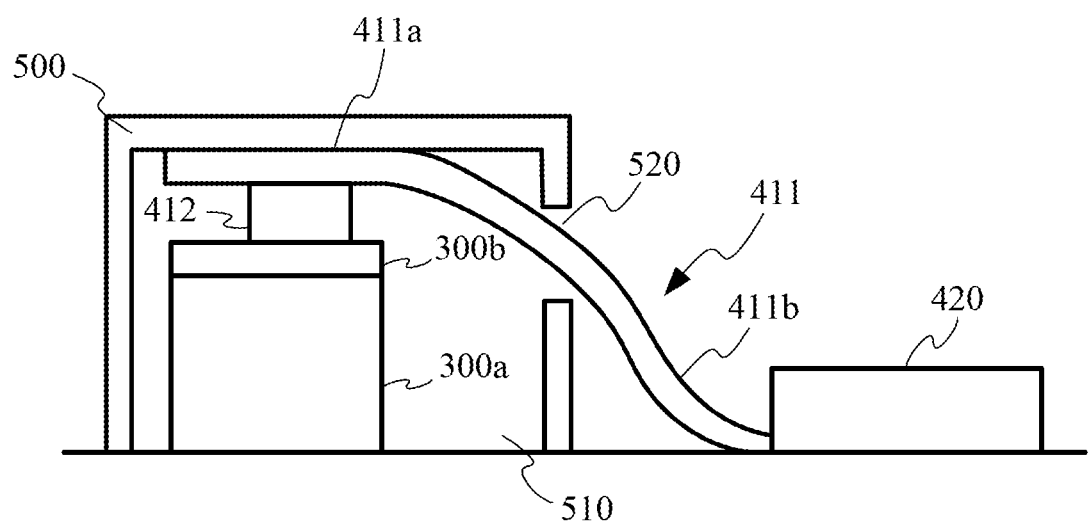
FIG. 3 is a schematic diagram of a partial structure of circuit boards where charge pump chips are provided in an electronic device according to an exemplary embodiment.

FIG. 3 is a schematic diagram of a partial structure of circuit boards where charge pump chips are provided in an electronic device according to an exemplary embodiment. In an embodiment, as illustrated in FIG. 2, the control component 400 includes a temperature detection device 410 and a control device 420 connected to the temperature detection device 410.

The temperature detection device 410 is coupled to one charge pump chip, and is configured to output a detection signal based on the temperature of the charge pump chip. In an embodiment of the present disclosure, as illustrated in FIG. 3, the temperature detection device 410 includes a flexible printed circuit 411, and a temperature detection circuit provided on the flexible printed circuit 411.

The flexible printed circuit 411 includes a first part 411*a* disposed above the charge pump chip, and a second part 411*b* connected to the control device 420. As illustrated in FIG. 3, the first part 411*a* and the second part 411*b* are two ends of the flexible printed circuit.

The temperature detection circuit is arranged on a surface facing the charge pump chip of the first part 411*a*, and includes a temperature-sensitive element 412 attached to the charge pump chip. The impedance of the temperature-sensitive element 412 changes with an ambient temperature. Therefore, under different ambient temperature conditions, the temperature-sensitive element 412 has different divided voltages in the temperature detection circuit. Furthermore, the temperature detection circuit outputs a detection signal (for example, the detection signal indicates a value of the divided voltage of the temperature-sensitive element 412, that is, an analog signal) based on the voltage shared by the temperature-sensitive element 412. The detection signal represents the ambient temperature of an environment where the temperature-sensitive element 412 is.

The charge pump chip includes a package housing 300*a*, and a heat dissipation member 300*b* provided on the package housing 300*a*. The temperature-sensitive element 412 is attached to the heat dissipation member 300*b*. In this manner, the impedance of the temperature-sensitive element 412 changes as the temperature of the charge pump chip changes. Furthermore, the temperature detection circuit outputs the detection signal based on the value of the divided voltage of the temperature-sensitive element 412. The detection signal represents the temperature of the charge pump chip.

The heat dissipation member 300b may be a heat dissipation coating, which is covered on the package housing 300a of the charge pump chip. With the heat dissipation member 300b, the heat generated by the package housing 300a is dispersed evenly, thereby ensuring an even distribution of heat on a contact surface of the temperature-sensitive element 412 and the heat dissipation member 300b, and ensuring that an impedance change of the temperature-sensitive element 412 accurately reflects a temperature change of the charge pump chip.

In addition, in embodiments of the present disclosure, a protective housing 500 is provided outside the charge pump chip to cover the charge pump chip. The protective housing 500 includes an accommodation chamber 510 accommodating the charge pump chip, and a through hole 520 communicating with the accommodation chamber and the outside of the protective housing 500.

The flexible printed circuit 411 is provided through the through hole 520. The first part 411a of the flexible printed circuit 411 is located inside the accommodation chamber 510, and the second part 411b of the flexible printed circuit 411 is located outside the accommodation chamber 510. In addition, the first part 411a is coupled to the protective housing 500. For example, the first part 411a is connected to an inner wall surface of the accommodation chamber 510. In this manner, the protective housing 500 ensures that the temperature-sensitive element 412 on the flexible printed circuit 411 is stably attached to the charge pump chips, so as to prevent the temperature detection device from being interfered by other factors around the charge pump chip, and to accurately detect the temperature of the charge pump chip.

In addition, one temperature detection device 410 is provided on each charge pump chip, that is, one temperature detection device 410 outputs the detection signal based on the temperature of one charge pump chip.

Figure 4:
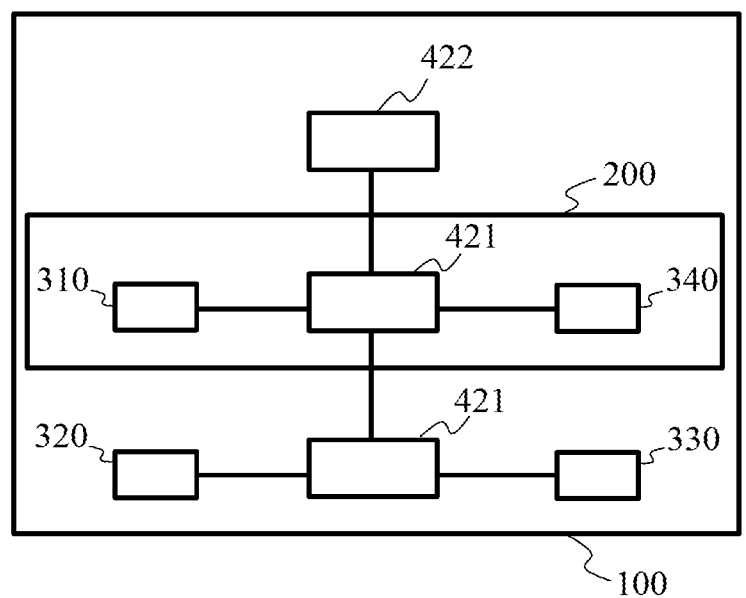
FIG. 4 is a schematic diagram of circuit boards in an electronic device according to yet another exemplary embodiment.

The control device 420 can be configured to control on or off of the charge pump chip based on the detection signal output by the temperature detection device. FIG. 4 is a schematic diagram of circuit boards in an electronic device according to yet another exemplary embodiment. In an embodiment, as illustrated in FIG. 4, the control device 420 includes a single-chip microcomputer 421 and a processor 422.

The processor 422 is provided on the first circuit board 100, coupled to the temperature detection device 410, and is configured to control, based on the detection signal outputted by the temperature detection device 410, the on or off of the charge pump chip in the screen-on charging state. Optionally, the processor 422 receives the detection signal outputted by the temperature detection device 410, and converts the detection signal into a digital signal, and then determines the temperature of the charge pump chip based on the digital signal. Optionally, the processor 422 is a central processing unit of the electronic device. In the screen-on charging state, the central processing unit is in the working state, and thus the processor 422 is used to control the on or off of the charge pump chip to increase the processing speed.

The single-chip microcomputer 421 is disposed on at least one of the first circuit board 100 and the second circuit board 200. Optionally, the single-chip microcomputer 421 is provided on the first circuit board 100 or the second circuit board 200, and is connected to the temperature detection devices and the charge pump chips on the first circuit board 100 and the second circuit board 200 through wires. Optionally, one single-chip microcomputer 421 is provided on the main circuit 100 and one single-chip microcomputer 421 is provided on the second circuit board 200, and the single-chip microcomputers 421 on the first circuit board 100 and the second circuit board 200 are connected to each other. In this manner, a wire width required for a connection to one single-chip microcomputer is reduced, thereby reducing the heat generated when the wire is powering on.

In addition, the single-chip microcomputer 421 is connected to the processor 422 or the temperature detection device 410. In the charge only state, most of the circuits in the processor 422 are in a non-working state. At this time, in order to ensure the smooth charging of the electronic device, the on or off of the charge pump chip is controlled by the single-chip microcomputer 421 based on the detection signal output by the temperature detection device 410. Optionally, the single-chip microcomputer 421 has an analog-to-digital conversion circuit. In such a case, the single-chip microcomputer 421 is directly connected to the temperature detection device 410. The single-chip microcomputer 421 converts the detection signal outputted by the temperature detection device 410 into the digital signal, and determines the temperature of the charge pump chip based on the digital signal, thereby controlling the on or off of the charge pump chip.

Optionally, the single-chip microcomputer 421 does not have an analog-to-digital conversion circuit. In such a case, in the charge only state, circuits with low power consumptions in the processor 422, such as the analog-to-digital conversion circuit, are in the working state. Furthermore, the analog-to-digital conversion circuit in the processor 422 converts the detection signal outputted by the temperature detection device 410 into the digital signal. The single-chip microcomputer 421 receives the digital signal and determines the temperature of the charge pump chip based on the digital signal, thereby controlling the on or off of the charge pump chip.

Figure 5:
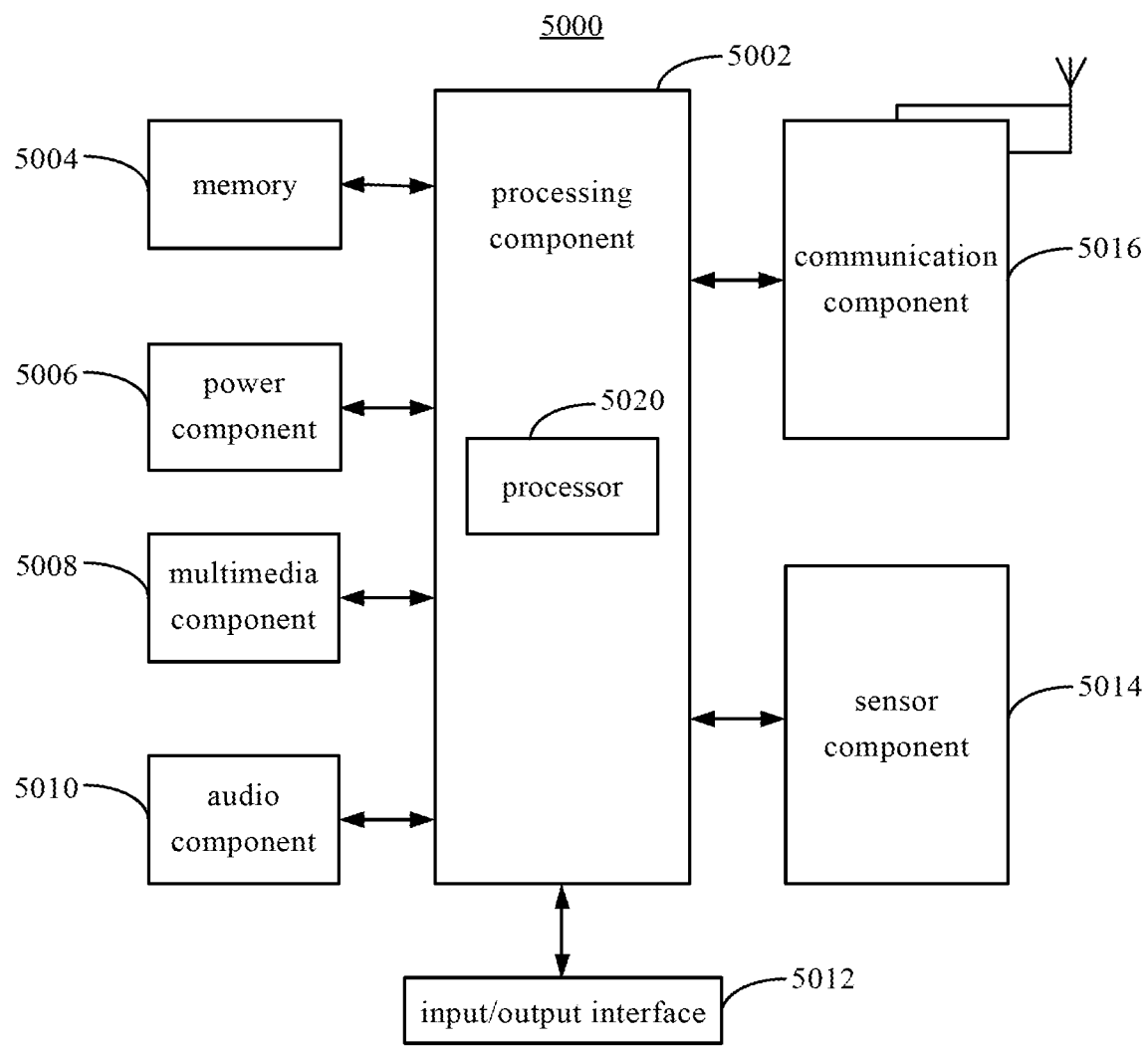
FIG. 5 is a block diagram of an electronic device according to an exemplary embodiment.

FIG. 5 is a block diagram of an electronic device according to an exemplary embodiment. As illustrated in FIG. 5, the electronic device 5000 may include one or more of the following components: a processing component 5002, a memory 5004, a power component 5006, a multimedia component 5008, an audio component 5010, an input/output (I/O) interface 5012, a sensor component 5014, a communication component 5016, and an image collection component.

The processing component 5002 normally controls the overall operation (such as operations associated with displaying, telephone calls, data communications, camera operations and recording operations) of the electronic device 5000. The processing component 5002 may include one or a plurality of processors 5020 to execute instructions. In addition, the processing component 5002 may include one or a plurality of units to facilitate interactions between the processing component 5002 and other components. For example, the processing component 5002 may include a multimedia unit to facilitate interactions between the multimedia component 5008 and the processing component 5002.

The memory 5004 is configured to store various types of data to support operations at the electronic device 5000. Examples of such data include instructions for any application or method operated on the electronic device 5000, contact data, phone book data, messages, images, videos and the like. The memory 5004 may be realized by any type of volatile or non-volatile storage devices, or a combination thereof, such as a static random access memory (SRAM), an electrically erasable programmable read only memory (EEPROM), an erasable programmable read only memory (EPROM), a programmable read only memory (PROM), a read only memory (ROM), a magnetic memory, a flash memory, a disk or an optical disk.

The power component 5006 provides power to various components of the electronic device 5000. The power component 5006 may include a power management system, one or a plurality of power sources and other components associated with power generation, management, and distribution of the electronic device 5000.

The multimedia component 5008 includes a screen that provides an output interface between the electronic device 5000 and a target object. In some embodiments, the screen may include a liquid crystal display (LCD) and a touch panel (TP). If the screen includes a touch panel, the screen may be implemented as a touch screen to receive input signals from the user. The touch panel includes one or a plurality of touch sensors to sense touches, slides, and gestures on the touch panel. The touch sensor may sense not only the boundary of the touches or sliding actions, but also the duration and pressure related to the touches or sliding operations.

The audio component 5010 is configured to output and/or input an audio signal. For example, the audio component 5010 includes a microphone (MIC) that is configured to receive an external audio signal when the electronic device 5000 is in an operation mode such as a call mode, a recording mode, and a voice recognition mode. The received audio signal may be further stored in the memory 5004 or transmitted via the communication component 5016. In some embodiments, the audio component 5010 further includes a speaker for outputting audio signals.

The I/O interface 5012 provides an interface between the processing component 5002 and a peripheral interface unit. The peripheral interface unit may be a keyboard, a click wheel, a button and the like.

The sensor assembly 5014 includes one or a plurality of sensors for providing the electronic device 5000 with various aspects of status assessments. For example, the sensor component 5014 may detect an open/closed state of the electronic device 5000 and a relative positioning of the components. For example, the components may be a display and a keypad of the electronic device 5000. The sensor component 5014 may also detect a change in position of the electronic device 5000 or a component of the electronic device 5000, the presence or absence of contact of the target object with the electronic device 5000, the orientation or acceleration/deceleration of the electronic device 5000 and a temperature change of the electronic device 5000.

The communication component 5016 is configured to facilitate wired or wireless communication between the electronic device 5000 and other devices. The electronic device 5000 may access a wireless network based on any communication standard, such as Wi-Fi, 2G or 3G, or a combination thereof. In an exemplary embodiment, the communication component 5016 receives broadcast signals or broadcast-associated information from an external broadcast management system via a broadcast channel. In an exemplary embodiment, the communication component 5016 further includes a near field communication (NFC) module to facilitate short range communication. For example, in the NFC module, short range communication may be implemented based on radio frequency identification (RFID) technology, infrared data association (IrDA) technology, ultra-wideband (UWB) technology, Bluetooth (BT) technology and other technologies.

In an exemplary embodiment, the electronic device 5000 may be implemented by one or a plurality of application specific integrated circuits (ASICs), digital signal processors (DSPs), digital signal processing devices (DSPDs), programmable logic devices (PLDs), field programmable gate arrays (FPGA), controllers, microcontrollers, microprocessors, or other electronic components.

Other implementations of the present disclosure will be apparent to those skilled in the art after considering the specification and practicing the present disclosure disclosed herein. The present disclosure is intended to cover any variations, uses or adaptive changes of the present disclosure, which are in accordance with general principles of the present disclosure and include common knowledge or technical means in the art that are not disclosed herein. The specification and embodiments are to be regarded as illustrative only, and the real scope and spirit of the present disclosure are pointed out in the attached claims.

What is claimed is:

1. An electronic device, comprising:
a first circuit board;
a second circuit board that is provided on the first circuit board;
a battery;
a charge pump chipset coupled to the battery and including at least two charge pump chips provided on the first circuit board and at least two charge pump chips provided on the second circuit board, the charge pump chips on the first circuit board being coupled in parallel with the charge pump chips on the second circuit board; and
a control component that is configured to control one charge pump chip on the first circuit board and at least one charge pump chip on the second circuit board to simultaneously be in a working state and, in response to a temperature of the charge pump chip on the first circuit board in the working state being higher than a set threshold, switch any charge pump chip on the first circuit board having a temperature lower than the set threshold to the working state.

2. The electronic device of claim 1, wherein the at least two charge pump chips on the first circuit board and the at least two charge pump chips on the second circuit board are arranged on respective vertices of a polygon.

3. The electronic device of claim 2, wherein:
two charge pump chips are provided on the first circuit board, and two charge pump chips are provided on the second circuit board,
the charge pump chips on the first circuit board and the second circuit board are respectively arranged on four vertices of a quadrilateral, the two charge pump chips on the first circuit board are arranged on one side of the quadrilateral, and the two charge pump chips on the second circuit board are arranged on the other side of the quadrilateral, and
in a charge only state, the control component is configured to control two charge pump chips on a same diagonal of the quadrilateral to simultaneously be in the working state.

4. The electronic device of claim 3, wherein in the charge only state, the control component is further configured to:
in response to the temperature of each of the two charge pump chips on one diagonal in the working state being higher than the set threshold, switch the two charge pump chips on the other diagonal to the working state.

5. The electronic device of claim 3, wherein in a screen-on charging state, the control component is further configured to:
in response to a temperature of the charge pump chip in the working state on the first circuit board being higher than the set threshold, switch any charge pump chip on the first circuit board with a temperature lower than the set threshold to the working state, and maintain the two charge pump chips on the second circuit board in the working state.

6. The electronic device of claim 1, the control component further comprising:
a plurality of temperature detection devices, wherein one temperature detection device is coupled to one charge pump chip and configured to output a detection signal based on a temperature of the charge pump chip; and
a control device that is coupled to the plurality of temperature detection devices, respectively, and configured to control on or off of the charge pump chip based on the detection signal outputted by the temperature detection device.

7. The electronic device of claim 6, wherein the temperature detection device further comprises:
a flexible printed circuit including a first part facing the charge pump chip and a second part that is coupled to the control device; and
a temperature detection circuit that is arranged on a surface facing the charge pump chip of the first part and including a temperature-sensitive element coupled to the charge pump chip.

8. The electronic device of claim 7, wherein the charge pump chip further comprises a package housing and a heat dissipation member provided on the package housing, the temperature-sensitive element being attached to the heat dissipation member.

9. The electronic device of claim 7, wherein:
a protective housing is provided outside the charge pump chip to cover the charge pump chip,
the protective housing includes an accommodation chamber accommodating the charge pump chip, and a through hole communicating with the accommodation chamber and an outside of the protective housing, and
the flexible printed circuit is disposed through the through hole, the first part is located in the accommodation chamber and connected to the protective housing and the second part is located outside the accommodation chamber.

10. The electronic device of claim 6, wherein the control device further comprises:
a processor that is provided on the first circuit board, coupled to the temperature detection device, and configured to control the on or off of the charge pump chip in a screen-on charging state; and
a single-chip microcomputer that is provided on at least one of the first circuit board and the second circuit board, coupled to the temperature detection device or the processor, and configured to control the on or off of the charge pump chip in a charge only state.

11. The electronic device of claim 1, wherein the second circuit board further comprises a plurality of sub-circuit boards arranged at a set distance, and the charge pump chips are arranged on the plurality of sub-circuit boards in a one-to-one correspondence.

12. The electronic device of claim 1, wherein the charge pump chips are provided on a surface of the second circuit board facing away from the first circuit board.

13. The electronic device of claim 8, wherein the heat dissipation member is a heat dissipation coating covered on the package housing.

* * * * *